United States Patent
Lee et al.

(10) Patent No.: US 8,373,220 B1
(45) Date of Patent: Feb. 12, 2013

(54) NAND TYPE FLASH MEMORY FOR INCREASING DATA READ/WRITE RELIABILITY

(75) Inventors: Tzung Han Lee, Taipei (TW); Chung-Lin Huang, Taoyuan County (TW); Ron Fu Chu, Taipei (TW)

(73) Assignee: Inotera Memories, Inc., Taoyuan (TW)

( * ) Notice: Subject to any disclaimer, the term of this patent is extended or adjusted under 35 U.S.C. 154(b) by 3 days.

(21) Appl. No.: 13/224,561

(22) Filed: Sep. 2, 2011

(30) Foreign Application Priority Data

Jul. 29, 2011 (TW) .............................. 100126960 A

(51) Int. Cl.
*H01L 29/788* (2006.01)

(52) U.S. Cl. ....................................... 257/319; 257/314

(58) Field of Classification Search .................. 257/314, 257/315, 319
See application file for complete search history.

(56) References Cited

U.S. PATENT DOCUMENTS

| | | | | |
|---|---|---|---|---|
| 6,703,661 | B2 * | 3/2004 | Wu | ................................ 257/315 |
| 7,704,832 | B2 * | 4/2010 | Kai et al. | ...................... 438/258 |
| 2005/0087794 | A1 * | 4/2005 | Chen et al. | .................... 257/315 |

* cited by examiner

*Primary Examiner* — Thao P. Le
(74) *Attorney, Agent, or Firm* — Rosenberg, Klein & Lee

(57) ABSTRACT

A NAND type flash memory for increasing data read/write reliability includes a semiconductor substrate unit, a base unit, and a plurality of data storage units. The semiconductor substrate unit includes a semiconductor substrate. The base unit includes a first dielectric layer formed on the semiconductor substrate. The data storage units are formed on the first dielectric layer. Each data storage unit includes two floating gates formed on the first dielectric layer, two inter-gate dielectric layers respectively formed on the two floating gates, two control gates respectively formed on the two inter-gate dielectric layers, a second dielectric layer formed on the first dielectric layer, between the two floating gates, between the two inter-gate dielectric layers, and between the two control gates, and a third dielectric layer formed on the first dielectric layer and surrounding and connecting with the two floating gates, the two inter-gate dielectric layers, and the two control gates.

10 Claims, 3 Drawing Sheets

NAND TYPE FLASH MEMORY FOR INCREASING DATA READ/WRITE RELIABILITY

BACKGROUND OF THE INVENTION

1. Field of the Invention

The instant disclosure relates to a NAND type flash memory, and more particularly, to a NAND type flash memory for increasing data read/write reliability.

2. Description of Related Art

A flash Memory, a non-volatile memory, may keep the previously stored written data upon shutdown. In contrast to other storage media, e.g. hard disks, soft disks, magnetic tapes and so on, the flash memory has advantages of small volume, light weight, vibration-proof, low power consumption, and no mechanical movement delay in data access, therefore, is widely used as a storage media in consumer electronic devices, embedded systems, or portable computers.

There are two kinds of flash memory: an NOR flash memory and an NAND flash memory. An NOR flash memory is characteristically of low driving voltage, fast access speed, high stability, and is widely applied in portable electrical devices and communication devices such as Personal Computers, mobile phones, personal digital assistances, and set-top boxes. An NAND flash memory is specifically designed as data storage media, for example, a secure digital memory card, a compact flash card, and a memory stick card. Charges move across a floating gate relying on charge coupling which determines a threshold voltage of a transistor under the floating gate upon writing, erasing and reading. In other words, in response to an injection of electrons into the floating gate, the logical status of the floating gate turns from 1 to 0; on the contrary, in response to a move of electrons away from the floating gate, the logical status of the floating gate turns from 0 to 1.

The NAND flash memory contains a plurality of blocks, and each block has a plurality of pages wherein each page is divided into data area and spare area. The data area may contain 2048 bytes that are used for storing data. The spare area may contain 64 bytes that are used for storing error correction code. However, the flash memory may fail to change data update-in-place, in other words, erasing a block including the non-blank page is required prior to writing data into a non-blank page. If a size of written data is over an assigned block, the filled pages in the assigned block may have to be removed to other blocks, and then erasing the assigned block is performed.

There are two kinds of NAND flash memory: a multi-level cell (MLC) NAND flash memory and a single-level cell (SLC) flash memory. A cell of the MLC NAND flash memory includes a floating gate for storing various charge levels indicative of binary values 00, 01, 10, and 11. Therefore, each MLC NAND flash memory cell can store four values at one time. Conversely, the SLC NAND flash memory cell contains thinner oxide film between the floating gate and the source. Voltage is applied onto the floating gate during writing process, thereby the stored charge being driven to flow out through the source. Each SLC NAND flash memory cell may store only one-bit data, as is less than the MLC NAND flash memory cell.

SUMMARY OF THE INVENTION

One aspect of the instant disclosure relates to a NAND type flash memory for increasing data read/write reliability.

One of the embodiments of the instant disclosure provides a NAND type flash memory for increasing data read/write reliability, comprising: a semiconductor substrate unit, a base unit, and a plurality of data storage units. The semiconductor substrate unit includes at least one semiconductor substrate. The base unit includes a first dielectric layer formed on the semiconductor substrate. The data storage units are adjacent to each other and formed on the first dielectric layer by a semiconductor manufacturing process. Each data storage unit includes at least two floating gates formed on the first dielectric layer and separated from each other by a predetermined distance, at least two inter-gate dielectric layers respectively formed on the two floating gates and respectively corresponding to the two floating gates, at least two control gates respectively formed on the two inter-gate dielectric layers and respectively corresponding to the two inter-gate dielectric layers, a second dielectric layer formed on the first dielectric layer, between the two floating gates, between the two inter-gate dielectric layers, and between the two control gates, and a third dielectric layer formed on the first dielectric layer and surrounding and tightly connecting with the two floating gates, the two inter-gate dielectric layers, and the two control gates.

Therefore, each data storage unit includes at least two floating gates, at least two inter-gate dielectric layers, and at least two control gates, thus the NAND type flash memory of the instant disclosure can increase data read/write reliability such as read/write cycle index or usage lifetime.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
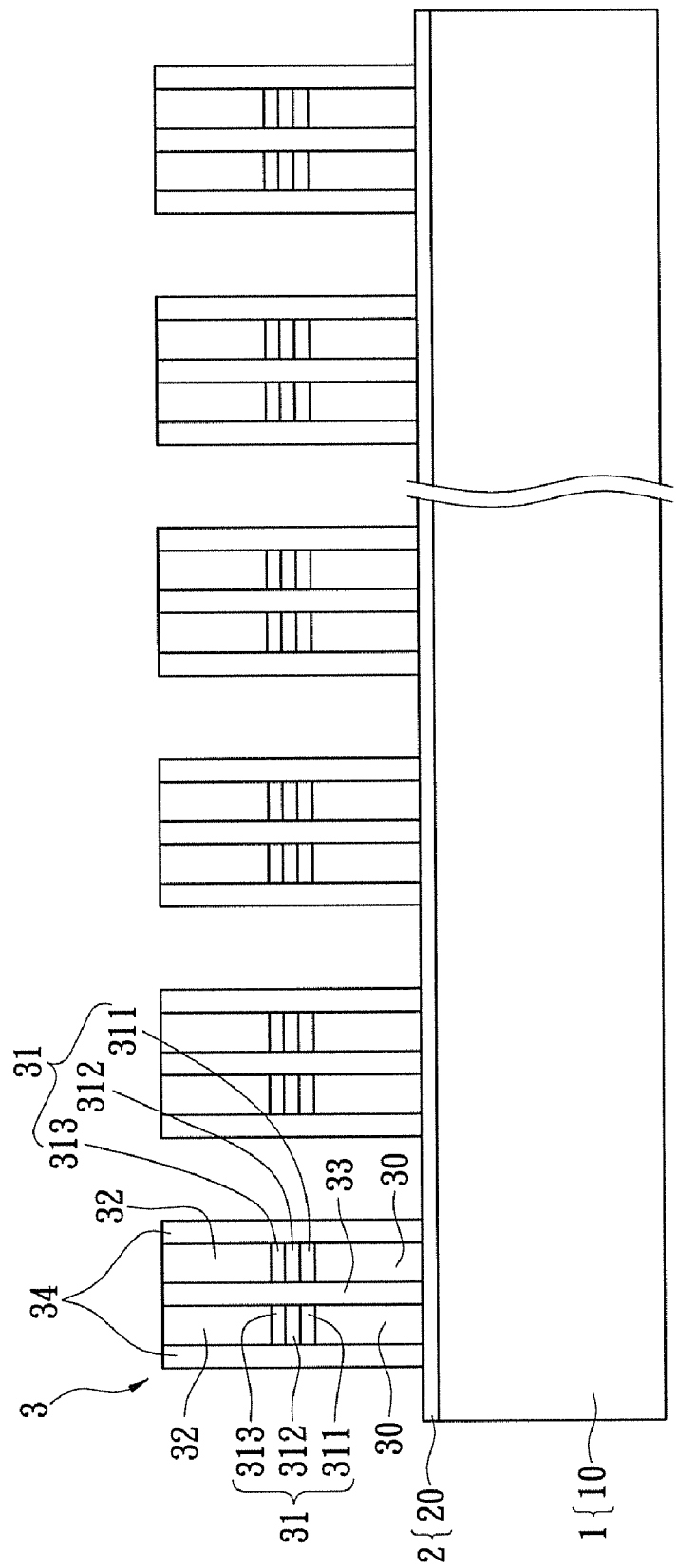
FIG. 1 shows a lateral, schematic view of the NAND type flash memory according to the instant disclosure.

Referring to FIG. 1, where the instant disclosure provides a NAND type flash memory for increasing data read/write reliability, comprising: a semiconductor substrate unit 1, a base unit 2, and a plurality of data storage units 3.

The semiconductor substrate unit 1 includes at least one semiconductor substrate 10. For example, the semiconductor substrate 10 may be a silicon substrate or any type of substrate formed by a semiconductor manufacturing process. In addition, the base unit 2 includes a first dielectric layer 20 formed on the semiconductor substrate 10. For example, the first dielectric layer 20 may be an oxide layer or any type of insulation layer formed by a semiconductor manufacturing process.

Moreover, the data storage units 3 are adjacent to each other and formed on the first dielectric layer 20 by a semiconductor manufacturing process. The data storage units 3 are electrically connected with each other in series to form a NAND string (or row), and the NAND string includes a source zone and a drain zone respectively formed on two sides thereof. In addition, each data storage unit 3 includes at least two floating gates 30, at least two inter-gate dielectric layers 31, at least two control gates 32, a second dielectric layer 33, and a third dielectric layer 34. The two floating gates 30 are formed on the first dielectric layer 20 and separated from each other by a predetermined distance. The two inter-gate dielectric layers 31 are respectively formed on the two floating gates 30 and respectively correspond to the two floating gates 30. The two control gates 32 are respectively formed on the two inter-gate dielectric layers 31 and respectively correspond to the two inter-gate dielectric layers 31. The second dielectric layer 33 is formed on the first dielectric layer 20, between the two floating gates 30, between the two inter-gate dielectric layers 31, and between the two control gates 32. The third dielectric layer 34 is formed on the first dielectric layer 20 and surrounds and tightly connects with the two floating gates 30, the two inter-gate dielectric layers 31, and the two control gates 32. In other words, the two floating gates 30, the two inter-gate dielectric layers 31, and the two control gates 32 are surrounded by the third dielectric layer 34, and the third dielectric layer 34 simultaneously contacts one part of the peripheral surface of each floating gate 30, one part of the peripheral surface of each inter-gate dielectric layer 31, and one part of the peripheral surface of each control gate 32.

For example, the first dielectric layer 20, the second dielectric layer 33, and the third dielectric layer 34 may be oxide layers or any type of insulation layers formed by a semiconductor manufacturing process. Moreover, each inter-gate dielectric layer 31 may include a first oxide layer 311 formed on the corresponding floating gate 30, a nitride layer 312 formed on the first oxide layer 311, and a second oxide layer 313 formed on the nitride layer 312. Therefore, the inter-gate dielectric layer 31 can be formed as an ONO layer. In addition, each floating gate 30 can be covered by the first dielectric layer 20, the second dielectric layer 33, the third dielectric layer 34, and the inter-gate dielectric layer 31 at the same time. The peripheral surface of each control gate 32 can be covered by the second dielectric layer 33 and the third dielectric layer 34, and the top surface of each control gate 32 can be exposed.

Figure 2:
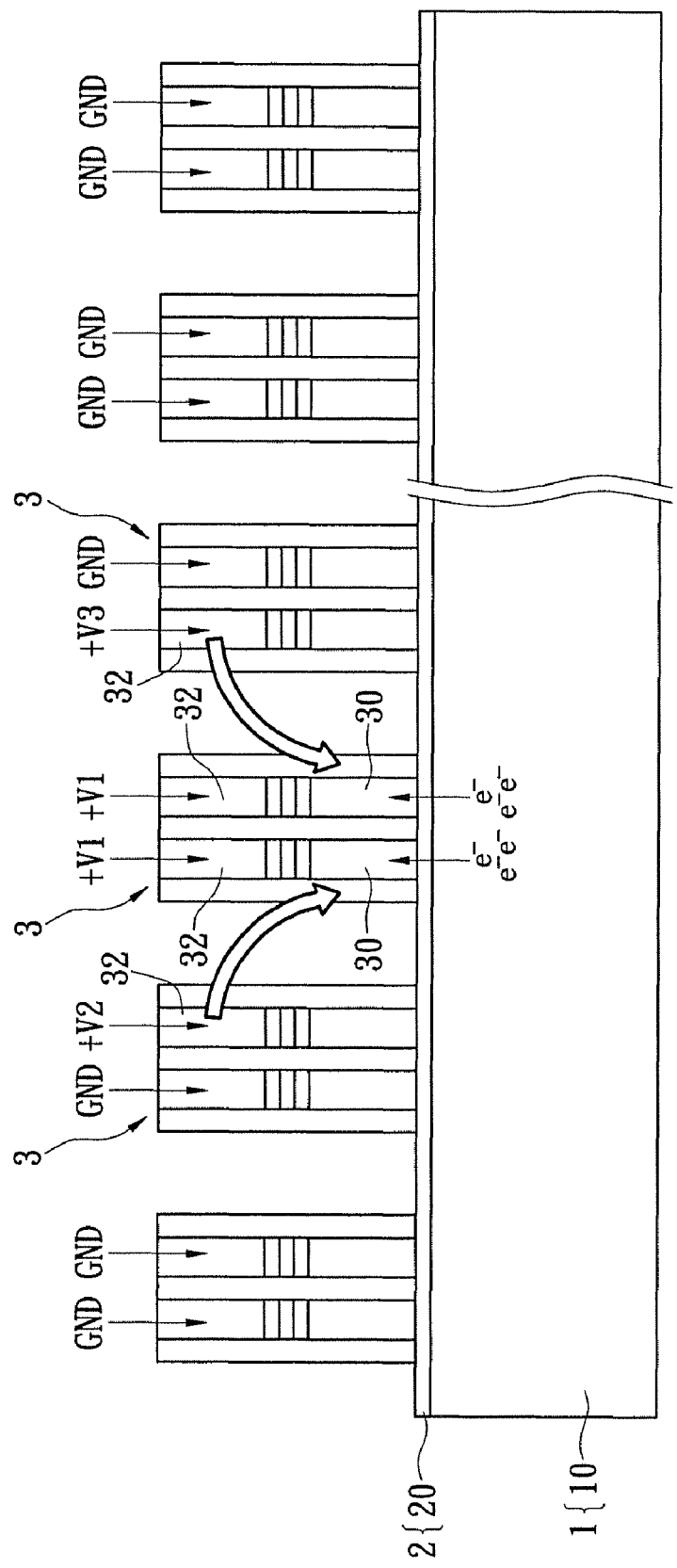
FIG. 2 shows a lateral, schematic view of the NAND type flash memory operated in a write mode according to the instant disclosure.

Referring to FIG. 2, when two positive voltages (+V1) are respectively provided to the two control gates 32 of a predetermined data storage unit 3, many negative electrons (e−) can be moved from the semiconductor substrate 10 into the two floating gates 30 of the predetermined data storage unit 3 through the first dielectric layer 20, in order to write data into the NAND type flash memory. At the same time, when two positive voltages (+V2, +V3) are provided to the two control gates 32 of another two adjacent data storage units 3 (the other two control gates 32 of the two adjacent data storage units 3 and the other data storage units 3 are connected to grounding (GND)), the two control gates 32 of another two adjacent data storage units 3 as two assist gates are respectively electrically coupled with the two floating gates 30 of the predetermined data storage unit 3 (as the two directions of the two arrows shown in FIG. 2). Therefore, the two floating gates 30 of each of the data storage units 3 or any data storage unit 3 can respectively electrically couple with the two control gates 32 of two adjacent data storage units 3 (as the two arrows from two control gates 32 to the two floating gates 30 shown in FIG. 2)

In other words, the two positive voltages (+V1) can be respectively provided to the two control gates 32 of the predetermined data storage unit 3, thus the two control gates 32 of the predetermined data storage unit 3 can directly and respectively electrically couple with the two corresponding floating gates 30 of the predetermined data storage unit 3. In addition, the two positive voltages (+V2, +V3) can be provided to the two control gates 32 of the two adjacent data storage units 3, thus the two control gates 32 of the two adjacent data storage units 3 can respectively electrically couple with the two floating gates 30 of the predetermined data storage unit 3.

Figure 3:
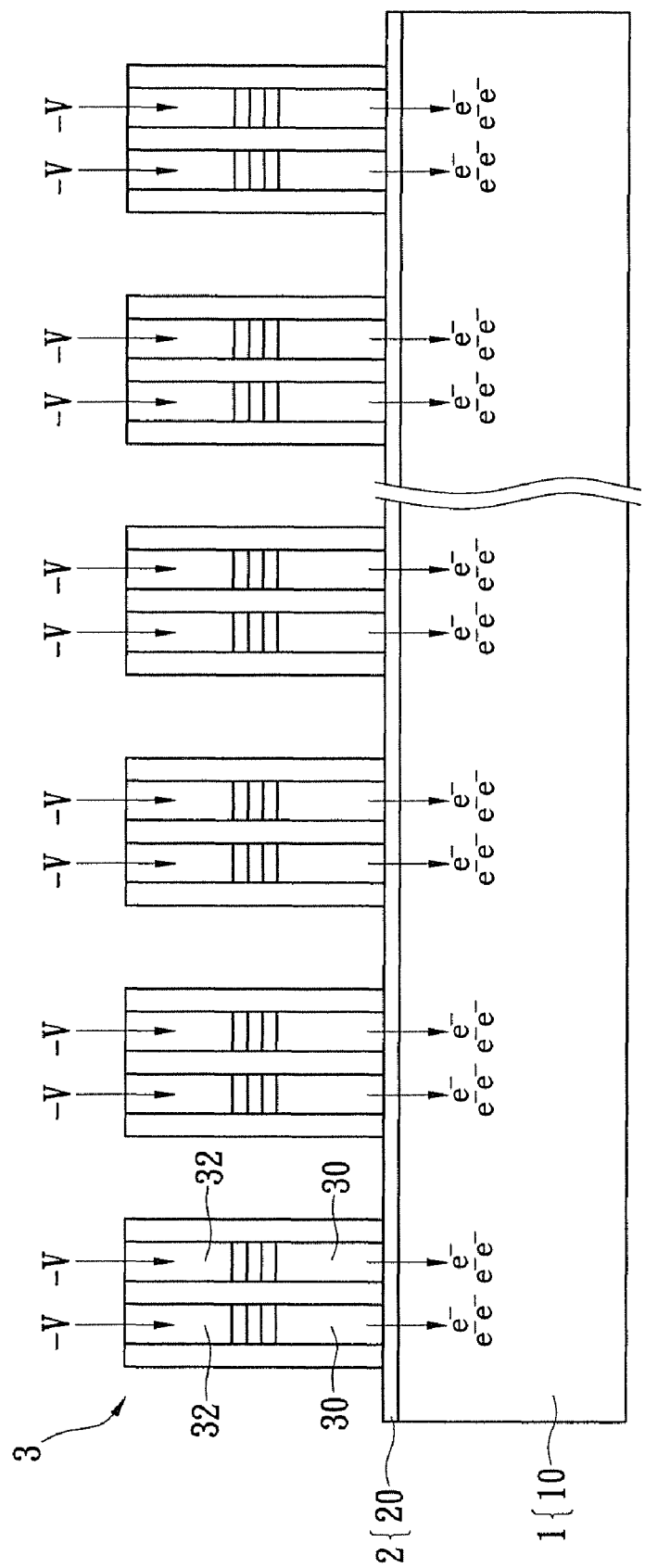
FIG. 3 shows a lateral, schematic view of the NAND type flash memory operated in an erase mode according to the instant disclosure.

Referring to FIG. 3, when the negative voltage (−V) is provided to the control gate 32 of each data storage unit 3, many negative electrons (e−) can be moved from the two floating gates 30 of each data storage unit 3 into the semiconductor substrate 10 into through the first dielectric layer 20, in order to erase data from the NAND type flash memory.

Because of the way the layers stack in the stacked gates memory cell, the IGI layer (inter-gate insulator layer) is sandwiched at least between the floating gate electrode (FG) and the control gate electrode (CG). The inter-gate insulator (IGI) layer typically contains a series of different dielectric materials. The classical combination is that of silicon Oxide, silicon Nitride and again silicon Oxide in the recited order, which hence is named "ONO".

The insulatively-isolated floating gate (FG) of a stacked gates cell is intended to store a relatively precise amount of charge and to retain that stored amount of charge even when external power is turned off. The amount of charge stored by the FG can be used to define the data state of the memory cell. The state of the memory cell can be altered by moving additional charge into the FG for representing a first data state and by removing charge from the FG for representing another data state. Different mechanisms may be used for injecting charge into or removing charge from the FG, including hot carrier injection and/or Fowler-Nordheim tunneling.

The charged or uncharged state of the floating gate (FG) can be sensed by applying a cell-read voltage to the control gate (CG), where the cell-read voltage is selected to cause a first magnitude of current conduction between the drain and source regions of the cell when the floating gate (FG) is in a first programmed state and to cause no or a different magnitude of IDS to flow when the floating gate (FG) is in another programmed state. Some devices store multiple data bits per cell, where each of different amounts of charge trapped within the FG represents a different multi-bit pattern. During data write and/or erase operations, it is common to apply relatively large voltages to the control gate (CG) so as to induce Fowler-Nordheim tunneling and/or other charge transport mechanisms between the floating gate (FG) and one or more other electrode regions within the memory cell (including source and/or drain regions).

It is important, for purposes of carrying out the various read and write/erase operations of floating gate type memory cells (e.g., stacked gate cells), to establish an appropriate pattern of electric field intensities through the insulators, especially the ones that surround the charge-storing, floating gate (FG). These electric fields (E-fields) may be established by generating correspondingly appropriate voltages between the control gate (CG), the drain, the source and/or substrate regions of the memory cell. The electric field intensity in dielectric insulators is usually a function of voltage difference (V) divided by dielectric thickness (d) and multiplied by dielectric constant (E=kV/d). Capacitive coupling is a function of plate area divided by dielectric thickness (C=f(kA/d)). In order to get consistent results from one mass produced device to the next, it is important to maintain precise control, during mass production, over the per-cell plate-area (A), the dielectric thickness (d) and the dielectric constant (k) of the various insulators which surround the FG of each cell so that same results will occur in one device and the next for a given control gate voltage. Stated otherwise, consistently same capacitive coupling should occur, without excessive leakage, from one mass produced device to the next as measured between the CG, the FG, the source, the drain and the substrate.

In conclusion, each data storage unit includes at least two floating gates, at least two inter-gate dielectric layers, and at least two control gates, thus the NAND type flash memory of the instant disclosure can increase data read/write reliability such as read/write cycle index or usage lifetime.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A NAND type flash memory for increasing data read/write reliability, comprising:
   a semiconductor substrate unit including at least one semiconductor substrate;
   a base unit including a first dielectric layer formed on the semiconductor substrate; and
   a plurality of data storage units adjacent to each other and formed on the first dielectric layer by a semiconductor manufacturing process, wherein each data storage unit includes at least two floating gates formed on the first dielectric layer and separated from each other by a predetermined distance, at least two inter-gate dielectric layers respectively formed on the two floating gates and respectively corresponding to the two floating gates, at least two control gates respectively formed on the two inter-gate dielectric layers and respectively corresponding to the two inter-gate dielectric layers, a second dielectric layer fowled on the first dielectric layer, between the two floating gates, between the two inter-gate dielectric layers, and between the two control gates, and a third dielectric layer formed on the first dielectric layer and surrounding and tightly connecting with the two floating gates, the two inter-gate dielectric layers, and the two control gates.

2. The NAND type flash memory of claim 1, wherein the semiconductor substrate is a silicon substrate, and the first dielectric layer, the second dielectric layer, and the third dielectric layer are oxide layers.

3. The NAND type flash memory of claim 1, wherein each inter-gate dielectric layer includes a first oxide layer formed on the corresponding floating gate, a nitride layer formed on the first oxide layer, and a second oxide layer formed on the nitride layer.

4. The NAND type flash memory of claim 1, wherein each floating gate is covered by the first dielectric layer, the second dielectric layer, the third dielectric layer, and the inter-gate dielectric layer.

5. The NAND type flash memory of claim 1, wherein the peripheral surface of each control gate is covered by the second dielectric layer and the third dielectric layer, and the top surface of each control gate is exposed.

6. A NAND type flash memory for increasing data read/write reliability, comprising:
   a semiconductor substrate unit including at least one semiconductor substrate;
   a base unit including a first dielectric layer formed on the semiconductor substrate; and
   a plurality of data storage units adjacent to each other and formed on the first dielectric layer by a semiconductor manufacturing process, wherein each data storage unit includes at least two floating gates formed on the first dielectric layer and separated from each other by a predetermined distance, at least two inter-gate dielectric layers respectively formed on the two floating gates and respectively corresponding to the two floating gates, at least two control gates respectively formed on the two inter-gate dielectric layers and respectively corresponding to the two inter-gate dielectric layers, a second dielectric layer formed on the first dielectric layer, between the two floating gates, between the two inter-gate dielectric layers, and between the two control gates, and a third dielectric layer formed on the first dielectric layer and surrounding and tightly connecting with the two floating gates, the two inter-gate dielectric layers, and the two control gates, wherein the two floating gates of each data storage unit are respectively electrically coupled with two control gates of two adjacent data storage units.

7. The NAND type flash memory of claim 6, wherein the semiconductor substrate is a silicon substrate, and the first dielectric layer, the second dielectric layer, and the third dielectric layer are oxide layers.

8. The NAND type flash memory of claim 6, wherein each inter-gate dielectric layer includes a first oxide layer formed on the corresponding floating gate, a nitride layer formed on the first oxide layer, and a second oxide layer formed on the nitride layer.

9. The NAND type flash memory of claim 6, wherein each floating gate is covered by the first dielectric layer, the second dielectric layer, the third dielectric layer, and the inter-gate dielectric layer.

10. The NAND type flash memory of claim 6, wherein the peripheral surface of each control gate is covered by the second dielectric layer and the third dielectric layer, and the top surface of each control gate is exposed.

* * * * *